(12) United States Patent
Wei et al.

(10) Patent No.: US 12,055,616 B2
(45) Date of Patent: Aug. 6, 2024

(54) ELECTRIC FIELD PROBE AND MAGNETIC FIELD PROBE CALIBRATION SYSTEM AND METHOD BASED ON MULTIPLE COMPONENTS

(71) Applicant: ZHEJIANG UNIVERSITY, Hangzhou (CN)

(72) Inventors: Xingchang Wei, Hangzhou (CN); Li Zhang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 466 days.

(21) Appl. No.: 17/355,193

(22) Filed: Jun. 23, 2021

(65) Prior Publication Data

US 2021/0318404 A1 Oct. 14, 2021

Related U.S. Application Data

(63) Continuation of application No. PCT/CN2020/133072, filed on Dec. 1, 2020.

(51) Int. Cl.
*G01R 35/00* (2006.01)

(52) U.S. Cl.
CPC .................................. *G01R 35/005* (2013.01)

(58) Field of Classification Search
CPC ... G01R 35/005; G01R 29/12; G01R 29/0878
See application file for complete search history.

(56) References Cited

FOREIGN PATENT DOCUMENTS

| CN | 101839949 A | | 9/2010 |
|----|-------------|---|--------|
| CN | 102401888 A | * | 4/2012 |
| CN | 102401888 A | | 4/2012 |
| CN | 104569888 A | | 4/2015 |
| CN | 105425014 A | | 3/2016 |
| CN | 106053965 A | | 10/2016 |
| CN | 106990277 A | | 7/2017 |

(Continued)

OTHER PUBLICATIONS

International Search Report (PCT/CN2020/133072); Date of Mailing: Mar. 1, 2021.

(Continued)

*Primary Examiner* — Daniel R Miller
*Assistant Examiner* — Edgar I Jimenez
(74) *Attorney, Agent, or Firm* — W&G Law Group

(57) ABSTRACT

The present application discloses calibration system and method for an electric field probe and a magnetic field probe based on multiple components. The system includes a microstrip line calibration assembly, a clamp, a vector network analyzer and a data processing unit; two groups of microstrip lines included in the microstrip line calibration assembly can be distributed on different routing layers of the same PCB board or on independent PCB boards; the first group of microstrip lines is single microstrip lines or differential lines under common mode excitation, which are used to generate a main component $H_y$ of a magnetic field, and the second group of microstrip lines is differential lines under differential mode excitation, which are used to generate a main component $E_x$ of an electric field.

4 Claims, 3 Drawing Sheets

(56) References Cited

FOREIGN PATENT DOCUMENTS

| | | | |
|---|---|---|---|
| CN | 108152575 A | | 6/2018 |
| CN | 109061320 A | * 12/2018 | ......... G01R 29/0878 |
| CN | 111398882 A | | 7/2020 |
| JP | H07191122 A | | 7/1995 |

OTHER PUBLICATIONS

"Study of Loop Probe Dimensions Influence on a Probe Calibration Factor in Near-Field Measurements"(Feb. 20, 2020) [Aleksandar Atanasković et al.]

* cited by examiner

ELECTRIC FIELD PROBE AND MAGNETIC FIELD PROBE CALIBRATION SYSTEM AND METHOD BASED ON MULTIPLE COMPONENTS

TECHNICAL FIELD

The present application relates to the technical field of probe calibration measurement, in particular to calibration system and method for an electric field probe and a magnetic field probe based on multiple components.

BACKGROUND

Electric field probes and magnetic field probes are used to detect the near-field radiation of an unknown electromagnetic interference source or antenna. In order to analyze the radiation accurately and quantitatively, it is necessary to know the proportional coefficient between the output voltage of electric field probe/magnetic field probe and the electric field/magnetic field to be measured, and this coefficient is defined as a Probe Factor (PF). The International Standards Organization IEC stipulates that a single standard microstrip line should be used as a calibration piece, the electric and magnetic fields above the calibration piece should be simulated by electromagnetic full-wave software, and then the calibration piece should be measured at the same position by a probe. The calibration factor is defined as a ratio of the output voltage of the magnetic field probe/electric field probe to the simulated magnetic field value/electric field value.

When the standard microstrip line works, one port is for excitation and the other port is a matched load of 50 ohms. It is considered that the field generated during its operation is the field of standard transverse electromagnetic wave. When the magnetic field probe is calculated, the magnetic field probe is placed above the center of the standard microstrip line, and the opening of the magnetic field probe is parallel to the current direction of the microstrip line. It is considered that the output of the magnetic field probe only depends on the coupling of the magnetic field probe with the magnetic field radiated by the standard microstrip line, irrespective of the electric field generated by the microstrip line. At present, the calibration method of a single microstrip line only considers the coupling between a probe and the main field component to be measured when calculating the calibration factor of a specific type of probe. For example, when calibrating a magnetic field probe, only the ratio of the amplitude of the magnetic field to be measured in a certain direction (e.g., $H_y$) to the output voltage of the magnetic field probe is considered. Similarly, when calibrating the electric field probe, only the ratio of the amplitude of the electric field to be measured (e.g., $E_x$) in a certain direction to the output of the electric field probe is considered, by which only the coupling ability of the magnetic field probe to the magnetic field to be measured or the coupling ability of the electric field probe to the electric field to be measured can be known.

When the magnetic field probe works, it will also be coupled to the space electric field, and the coupled space electric field will contribute to part of the output of the magnetic field probe, which is equivalent to the environmental noise of the probe. The unwanted coupling of the space electric field is ignored when calculating the PF in the current calibration methods. Similarly, for the electric field probe, the coupling of the space magnetic field or the environmental noise produced by the space magnetic field at the output end of the probe is usually ignored, which affects the accuracy of calibration. Therefore, it is necessary to provide a probe calibration method that takes the coupling of the magnetic field and electric field into account, so as to improve the calibration accuracy of the electric field probe and magnetic field probe, and to evaluate the ability of the probe to suppress environmental noise.

SUMMARY

In order to overcome the shortcomings of the prior art, the present application provides calibration system and method for an electric field probe and a magnetic field probe based on multiple components. For a magnetic field probe, the coupling of a magnetic field to a magnetic field probe and an electric field to a magnetic field probe are expressed respectively, so as to accurately obtain the coupling ability of the magnetic field probe to the magnetic field to be measured and the suppression degree of the magnetic field probe to non-to-be-measured electric field components; for the electric field probe, the coupling of the electric field to the electric field probe and the magnetic field to the electric field probe are expressed respectively, so that the coupling ability of the electric field probe to the electric field to be measured and the suppression degree of the electric field probe to the non-to-be-measured magnetic field can be accurately obtained. According to the present application, applied electric field and magnetic field components and coupling coefficients of the electric field probe and the magnetic field probe are respectively extracted to obtain more comprehensive and accurate calibration factors of the electric field probe and the magnetic field probe.

In order to achieve the above purpose, the present application adopts the following technical solution.

A calibration system for an electric field probe and a magnetic field probe based on multiple components, comprising a microstrip line calibration assembly, a clamp, a vector network analyzer and a data processing unit;

wherein the microstrip line calibration assembly comprises a first group of microstrip lines and a second group of microstrip lines, and the two groups of microstrip lines are distributed on different routing layers of a same PCB board or on independent PCB boards; one end of the first group of microstrip lines is connected with a first matched load, and the other end of the first group of microstrip lines is a first excitation port; one end of the second group of microstrip lines is connected with a second matched load, and the other end of the second group of microstrip lines is a second excitation port; the first group of microstrip lines and the second group of microstrip lines are perpendicular to each other, and a point 1 mm above a vertical intersection point of the first group of microstrip lines and the second group of microstrip lines is a calibration point, and a field probe fixedly installed on the clamp is perpendicular to the PCB board, and a probing center of the field probe coincides with the calibration point;

the vector network analyzer is respectively connected with the first excitation port on the first group of microstrip lines, the second excitation port on the second group of microstrip lines and an output port of the field probe; and the data processing unit is used for calculating a calibration factor of the field probe at each calibration frequency point.

Preferably, the first group of microstrip lines adopts single microstrip lines or differential lines under common mode excitation, and the second group of microstrip lines adopts differential lines under differential mode excitation.

Preferably, the calculation formula of the calibration factor is:

$$\begin{bmatrix} \alpha(f) \\ \beta(f) \end{bmatrix} = \begin{bmatrix} H_y^1(f) & E_x^1(f) \\ H_y^2(f) & E_x^2(f) \end{bmatrix}^{-1} \begin{bmatrix} S_{13}(f) \\ S_{23}(f) \end{bmatrix} \sqrt{2Z_3}$$

where for the magnetic field probe, $\alpha$ is the calibration factor of the probe to the magnetic field to be measured, and $\beta$ is the coupling degree of the probe to a non-to-be-measured electric field; for the electric field probe, $\alpha$ is the coupling degree of the probe to a non-to-be-measured magnetic field, and $\beta$ is the calibration factor of the probe to the electric field to be measured; $H_y^1$ and $E_x^1$ respectively represent a magnetic field strength and an electric field strength at the calibration point when an excitation power of 1W is applied to the first excitation port, $H_y^2$ and $E_x^2$ respectively represent a magnetic field strength and an electric field strength at the calibration point when an excitation power of 1W is applied to the second excitation port; $S_{13}$ and $S_{23}$ are scattering parameters measured by the vector network analyzer; $Z_3$ is an impedance of connected to a terminal of the probe; f is a calibration frequency.

The present application further discloses a calibration method based on the calibration system for an electric field probe and a magnetic field probe according to claim 1, comprising the following steps:

1) fixing a relative position of a microstrip line calibration assembly and a field probe to be calibrated, so that the field probe is perpendicular to a PCB board where the microstrip line is located, and a probing center of the field probe coincides with a calibration point;

2) connecting a first excitation port on a first group of microstrip lines, a second excitation port on a second group of microstrip lines and an output port of the field probe to a vector network analyzer respectively; applying excitation signals with different calibration frequencies through a signal source inside the vector network analyzer, and then measuring a scattering parameter matrix $$\begin{bmatrix} S_{11} & S_{12} & S_{13} \\ S_{12} & S_{22} & S_{23} \\ S_{13} & S_{23} & S_{33} \end{bmatrix}$$

of three ports the vector network analyzer, where matrix elements $S_{ij}$ (i, j=1,2,3) change with a frequency f, 3) for the microstrip line calibration assembly prepared according to step 1), applying 1W excitation power at the first excitation port on the first group of microstrip lines to obtain a magnetic field strength $H_y^1$ and an electric field strength $E_x^1$ at the calibration point; in the same way, applying 1W excitation power at the second excitation port of the second group of microstrip lines to obtain a magnetic field strength $H_y^2$ and an electric field strength $E_x^2$ at the calibration point; taking $H_y^1$, $E_x^1$, $H_y^2$, $E_x^2$ as reference values of an electromagnetic field generated by the microstrip line calibration assembly;

4) according to $S_{13}$ and $S_{23}$ obtained by the vector network analyzer in step 2) and $H_y^1$, $E_x^1$, $H_y^2$, $E_x^2$ obtained in step 3), calculating calibration factors $\alpha$ and $\beta$ of each calibration frequency point by the following formula:

$$\begin{bmatrix} \alpha(f) \\ \beta(f) \end{bmatrix} = \begin{bmatrix} H_y^1(f) & E_x^1(f) \\ H_y^2(f) & E_x^2(f) \end{bmatrix}^{-1} \begin{bmatrix} S_{13}(f) \\ S_{23}(f) \end{bmatrix} \sqrt{2Z_3}$$

where for the magnetic field probe, $\alpha$ is a calibration factor of the probe to a magnetic field to be measured, and $\beta$ is a coupling degree of the probe to a non-to-be-measured electric field; for the electric field probe, $\alpha$ is a coupling degree of the probe to a non-to-be-measured magnetic field, and $\beta$ is a calibration factor of the probe to an electric field to be measured.

The present application has the following beneficial effects.

The calibration system of the present application adopts two groups of microstrip lines, which can generate a main magnetic field component and a main electric field component which are perpendicular to each other on the horizontal plane; the responses of the electric field probe and the magnetic field probe are tested by using the magnetic field component and the electric field component to calibrate the probe, and two coupling coefficients are obtained.

In the process of probe calibration, not only the coupling of an external magnetic field to the magnetic field probe is considered, but also the coupling of an external electric field to the magnetic field probe is calculated, so that the coupling ability (or sensitivity) of the magnetic field probe to the magnetic field to be measured and the suppression ability to the non-to-be-measured electric field can be comprehensively and accurately measured. Similarly, for the electric field probe, not only the coupling of external electric field to the electric field probe is considered, but also the coupling of external magnetic field to the electric field probe is further calculated, so that the coupling ability (or sensitivity) of the electric field probe to the electric field to be measured and the suppression ability to the non-to-be-measured magnetic field can be comprehensively and accurately measured. This method overcomes the limitation that the current single magnetic field component or single electric field component can only measure the coupling degree of the probe to the field to be measured, and can comprehensively measure the suppression degree of an electric field probe to the non-to-be-measured magnetic field and a magnetic field probe to the non-to-be-measured electric field, which has great reference value in electromagnetic near-field scanning.

DESCRIPTION OF EMBODIMENTS

The present application will be further explained with reference to the attached drawings of the specification.

Figure 1:
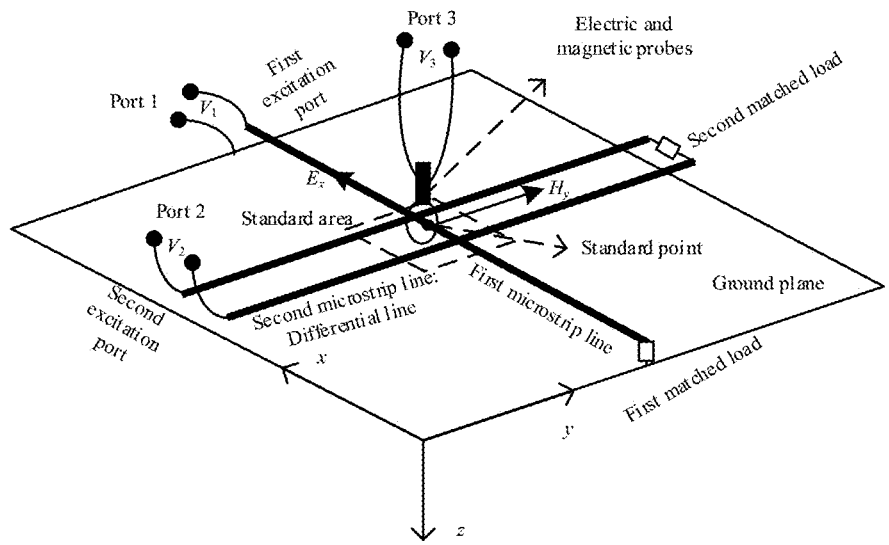
FIG. 1 is a schematic diagram of the calibration system of the present application.

A calibration system for an electric field probes and a magnetic field prob based on multiple components is shown in FIG. 1, which includes a microstrip line calibration assembly, a clamp, a vector network analyzer and a data processing unit, wherein the data processing unit is used for calculating a calibration factor of a field probe at each calibration frequency point.

Figure 2:
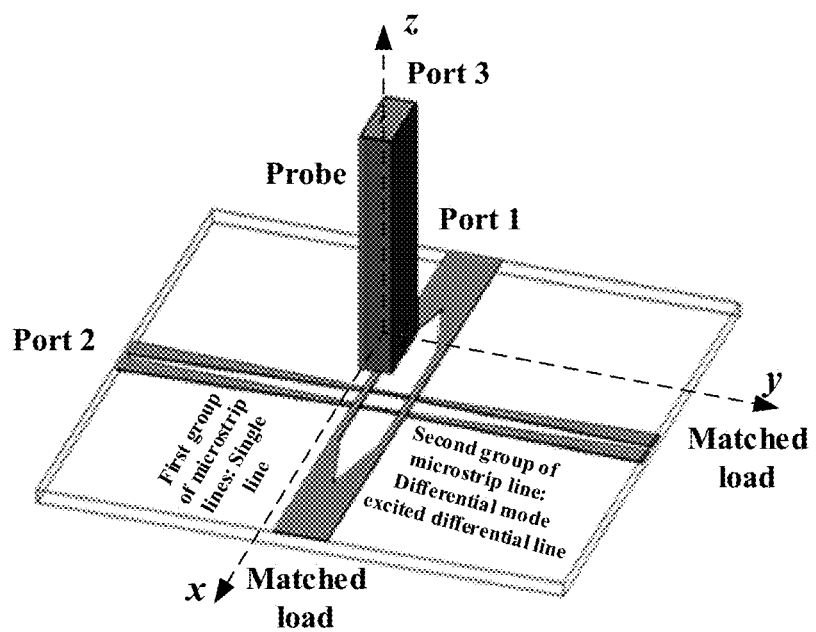
FIG. 2 is a schematic diagram of a microstrip line calibration assembly in an embodiment of the present application, in which two groups of microstrip lines are distributed on the same PCB, located at different routing layers of the PCB and perpendicular to each other.

The microstrip line calibration assembly includes a first group of microstrip lines and a second group of microstrip lines. Two groups of microstrip lines can be distributed on different routing layers of the same PCB, as shown in FIG. 1 and FIG. 2, or on independent PCB, as shown in FIG. 3. The first group of microstrip lines are single microstrip lines or differential lines under common mode excitation for generating a magnetic field component $H_y$, and the second group of microstrip lines are differential lines under differential mode excitation for generating electric field component $E_x$; one end of the first group of microstrip lines is connected with a first matched load, and the other end of the first group of microstrip lines is a first excitation port; one end of the second group of microstrip lines is connected with a second matched load, and the other end of the second group of microstrip lines is a second excitation port; the first group of microstrip lines and the second group of microstrip lines are vertically distributed/placed, and a calibration point is located 1 mm above the vertical intersection point of the first group of microstrip lines and the second group of microstrip lines; the field probe fixedly installed on the clamp is perpendicular to the PCB board, and the probing center of the field probe coincides with the calibration point.

In the specific implementation of the present application, the microstrip line calibration assembly is as shown in FIG. 2 (two groups of microstrip lines are on different wiring layers of the same PCB board) or as shown in FIG. 3 (two groups of microstrip lines are located on different PCB boards).

1) The first group of microstrip lines: single matched microstrip lines (as shown in FIG. 1) or common-mode excited and matched differential lines (as shown in FIGS. 2 and 3) are distributed along the x direction, and the main magnetic field component generated above is $H_y$. One end of the microstrip line is connected to a matched load, and the other end is defined as an excitation port 1 (for a single microstrip line, excitation is added between the microstrip line and the ground plane; for a differential line, excitation is added between two lines in parallel connection and the ground plane).

2) The second group of microstrip lines: the other group is differential mode excited and matched differential lines distributed along the y direction. Using differential mode excitation (excitation is added between two lines), the main electric field component generated above is $E_x$. One end of the differential microstrip line is connected to a matched load, and the other end is defined as an excitation port 2.

The calibration point is defined as a point 1 mm above the intersection of the center lines of the two groups of microstrip lines. According to the configuration of 1)-2), two perpendicular electromagnetic field components, $E_x$ and $H_y$, in the horizontal plane can be obtained at the calibration point.

For the calibration assembly shown in FIG. 2, where two groups of microstrip lines are distributed on the same PCB, field probes are placed above the microstrip lines through the clamp during calibration, and it only needs to perform measurement once using the vector network analyzer; for the calibration assembly shown in FIG. 3, where two groups of microstrip lines are distributed on different PCB boards, during calibration, the field probes are placed above the two groups of microstrip lines respectively, the positions of the probes keep unchanged, and the microstrip lines are replaced and measured twice by a vector network analyzer. The probing center of the probe coincides with the calibration point, as shown in FIG. 1, FIG. 2 and FIG. 3. The output end of the probe is defined as a port 3.

With the structures shown in FIG. 1, FIG. 2 and FIG. 3, the vector network analyzer is connected with the port 1, the port 2, and the output port 3 of the field probe respectively, and the excitation signals with different calibration frequencies are output through the signal source inside the vector network analyzer. For each calibration frequency f, the S-parameter scattering matrix of the port 3 network is measured by the vector network analyzer, and the following model is established:

$$\begin{bmatrix} S_{11} & S_{12} & S_{13} \\ S_{12} & S_{22} & S_{23} \\ S_{13} & S_{23} & S_{33} \end{bmatrix} \begin{bmatrix} a_1 \\ a_2 \\ a_3 \end{bmatrix} = \begin{bmatrix} b_1 \\ b_2 \\ b_3 \end{bmatrix} \quad (1)$$

where $a_1$ to $a_3$ and $b_1$ to $b_3$ are incident waves and reflected waves of three ports, respectively. Matrix elements $S_{ij}$(i, j=1,2,3) change with a frequency f, and are measured by vector network analyzer and satisfy reciprocity.

Because the two groups of microstrip lines are well matched, the following can be obtained from the S scattering parameter theory and formula (1):

when a 1V excitation voltage is applied to the port 1 and the port 2 is matched, $$V_3 = S_{13} \sqrt{\frac{Z_3}{Z_1}} \quad (2)$$

when a 1V excitation voltage is applied to the port 2 and the port 1 is matched, $$V_3 = S_{23} \sqrt{\frac{Z_3}{Z_2}} \quad (3)$$

In formulas (2) and (3), $V_3$ is the voltage when port 3 is connected with an impedance $Z_3$, and $Z_1$ and $Z_2$ are reference impedances of the ports 1 and 2, respectively. Next, by using a calibration algorithm, the output voltage $V_3$ of the probe is calculated by $E_x$ and $H_y$ at the calibration point, and is made to be equal to the formulas (2) and (3) respectively, thus solving the coupling coefficient of the probe to the external electric field and magnetic field.

1. Calibration Algorithm

A calibration assembly model of the microstrip lines is drawn, and $E_x$ and $H_y$ at the calibration point can be obtained by simulation with electromagnetic full-wave software. The simulated microstrip line calibration assembly model should be consistent with the microstrip lines used in the measurement, except that it does not include the probe or the clamp. With the structure shown in FIG. 1, the voltage $V_3$ at the port 3 is generated by induction of the electromagnetic fields $H_y$ and $E_x$ at the calibration point, and $V_3$ is proportional to $H_y$ and $E_x$ as follows:

$$V_3 = \alpha H_y + \beta E_x \quad (4)$$

where for the magnetic field probe, α is the calibration factor of the probe to the magnetic field to be measured, and β is the coupling degree of the probe to the non-to-be-measured electric field; for the electric field probe, α is the coupling degree of the probe to the non-to-be-measured magnetic field, and β is the calibration factor of the probe to the electric field to be measured. In formula (4), not only the main horizontal electric field component and the main horizontal magnetic field component generated by the microstrip line calibration assembly, but also the secondary horizontal electric field component and the secondary horizontal magnetic field component are considered.

When an excitation power of 1W is externally applied to the port 1 and the port 2 is matched, the simulated electromagnetic field at the calibration point is $(H_y^1, E_x^1)$, which is converted as a 1V excitation voltage is externally applied to the port 1 and combined with the formula (4), obtaining $$V_3 = \frac{\alpha H_y^1 + \beta E_x^1}{\sqrt{2Z_1}} \quad (5)$$

When an excitation power of 1W is externally applied to the port 2 and the port 1 is matched, the simulated electromagnetic field at the calibration point is $(H_y^2, E_x^2)$, which is converted as a 1V excitation voltage is externally applied to the port 2 and combined with the formula (4), obtaining $$V_3 = \frac{\alpha H_y^2 + \beta E_x^2}{\sqrt{2Z_2}} \quad (6)$$

Let (2)=(5), (3)=(6) and get $$\begin{bmatrix} \alpha(f) \\ \beta(f) \end{bmatrix} = \begin{bmatrix} H_y^1(f) & E_x^1(f) \\ H_y^2(f) & E_x^2(f) \end{bmatrix}^{-1} \begin{bmatrix} S_{13}(f) \\ S_{23}(f) \end{bmatrix} \sqrt{2Z_3} \quad (7)$$

Formula (7) is the calculation formula of the coupling coefficient finally obtained, where $$\begin{bmatrix} H_y^1(f) & E_x^1(f) \\ H_y^2(f) & E_x^2(f) \end{bmatrix}$$

is obtained from the simulation of electromagnetic full-wave software, and α and β are the calculated calibration factors or coupling coefficients.

$$\begin{bmatrix} S_{13}(f) \\ S_{23}(f) \end{bmatrix}$$

is from the measurement.

2. Method of Using Calibration Factors

When a calibrated magnetic field probe is used to measure the magnetic field to be measured, taking measurement $H_y$ as an example, the magnetic field probe is connected with a spectrum analyzer, and according to the voltage $V_3$ measured by the spectrum analyzer, the magnetic field to be measured can be calculated as $H_y=V_3/\alpha$; β is used to measure the coupling degree of the magnetic field probe to a non-to-be-measured electric field. The smaller β is, the smaller the influence of the non-to-be-measured electric field on the magnetic field probe is. When a calibrated electric field probe is used to measure the electric field to be measured, taking the measurement of $E_x$ as an example, the electric field probe is connected with a spectrum analyzer, and according to the voltage $V_3$ measured by the spectrum analyzer, the electric field to be measured can be calculated as $E_x=V_3/\beta$; α is used to measure the coupling degree of the electric field probe to a non-to-be-measured magnetic field. The smaller α is, the smaller the influence of the non-to-be-measured magnetic field on the electric field probe is.

3. Calculation Example of Calibration Factors

Figure 3A:
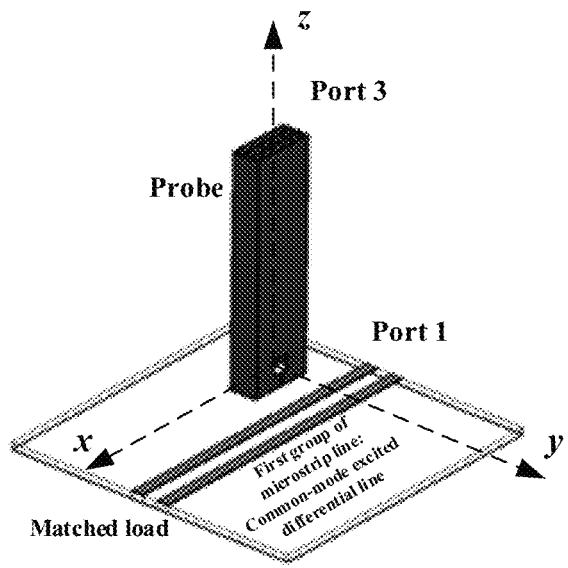
FIG. 3(a) is a schematic diagram for calibrating the first group of microstrip lines in an embodiment of the present application.
Figure 3B:
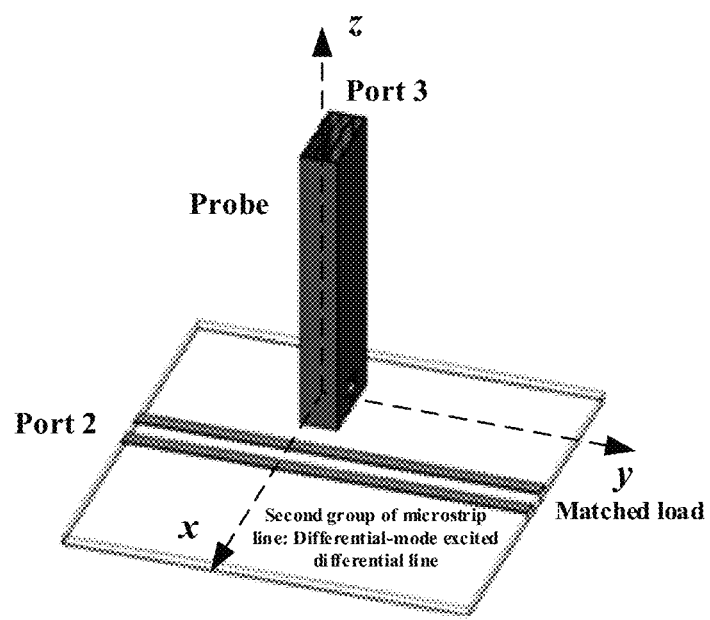
FIG. 3(b) is a schematic diagram for calibrating the second group of microstrip lines in the embodiment of the present application.
Figure 4:
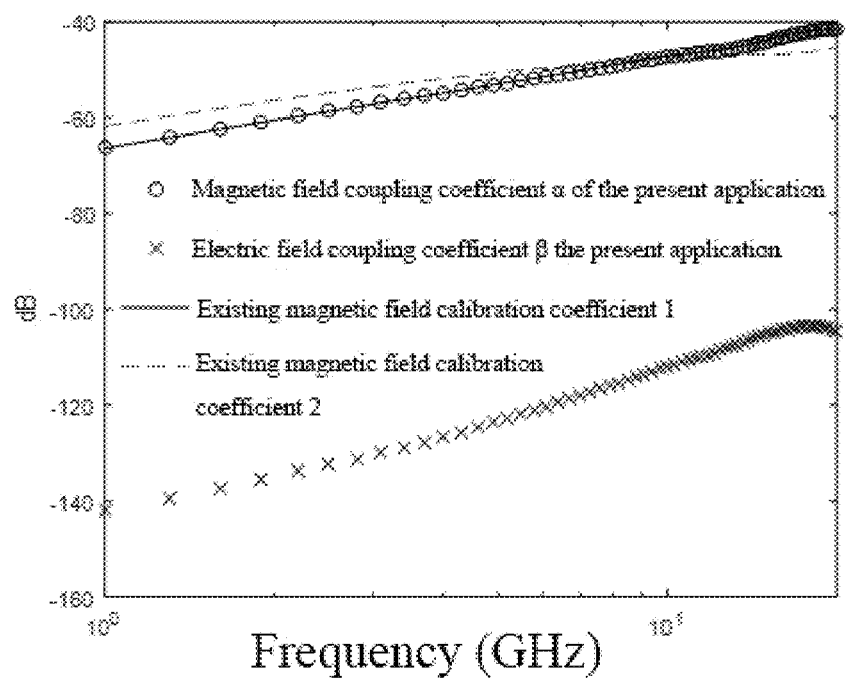
FIG. 4 is a comparison between the coupling coefficient of the present application and the existing magnetic field calibration coefficient.

FIG. 4 is a simulation result of a magnetic field probe calibration factor for measuring a certain magnetic field $H_y$ by using the calibration microstrip lines shown in FIG. 3. Wherein, "existing magnetic field calibration coefficient 1" refers to the magnetic field coupling factor calculated by the existing calibration method when the first group of microstrip lines in FIG. 3(a) are used as calibration pieces; "existing magnetic field calibration coefficient 2" refers to the magnetic field coupling factor calculated by the existing calibration method when the second group of microstrip lines in FIG. 3(b) are used as calibration pieces.

The main difference between the existing calibration method and the calibration method of the present application is that the existing calibration method only uses one group of microstrip lines as calibration pieces. It can be seen from the figure that:

1) FIG. 3(a) shows the first group of common-mode excited differential lines, which produce a larger magnetic field $H_y$ and a smaller electric field $E_x$. At this time, the non-to-be-measured electric field $E_x$ has little influence on the magnetic field probe, so the calculated magnetic field coupling coefficient α of the present application is in good agreement with the "existing magnetic field calibration coefficient 1", which proves that the present application is compatible with the existing magnetic field calibration coefficient.

2) FIG. 3(b) shows the second group of differential-mode excited differential lines, which produce a smaller magnetic field $H_y$ and a larger electric field $E_x$. At this time, the non-to-be-measured electric field $E_x$ has a great influence on the magnetic field probe, so the "existing magnetic field calibration coefficient 2" has an error and deviates from the "existing magnetic field calibration coefficient 1". The calculated electric field coupling coefficient β can well explain the deviation between "existing magnetic field calibration coefficient 2" and "existing magnetic field calibration coefficient 1": it is precisely because of the coupling (expressed by coupling coefficient β) between the non-to-be-measured electric field $E_x$ and the magnetic field probe that the magnetic field probe generates an error when detecting a weak magnetic field.

The above embodiment is only a preferable solution of the present application, but it is not intended to limit the present application. Those of ordinary skill in the technical field can make various changes and modifications without departing from the spirit and scope of the utility model. Therefore, all technical solutions obtained by equivalent substitutions or equivalent transformations fall within the protection scope of the present application.

What is claimed is:

1. A calibration system for an electric field probe and a magnetic field probe based on multiple components, comprising a microstrip line calibration assembly, a clamp, a vector network analyzer and a data processing unit, wherein the microstrip line calibration assembly comprises a first group of microstrip lines and a second group of microstrip lines, and the two groups of microstrip lines are distributed on different routing layers of a same PCB board, respectively, or distributed on independent PCB boards, respectively; one end of each microstrip line in the first group of microstrip lines is connected with a first matched load, and the other end of each microstrip line in the first group of microstrip lines is a first excitation port; one end of each microstrip line in the second group of microstrip lines is connected with a second matched load, and the other end of each microstrip line in the second group of microstrip lines is a second excitation port; the first group of microstrip lines and the second group of microstrip lines are perpendicular to each other, and a point 1 mm above a vertical intersection point of the first group of microstrip lines and the second group of microstrip lines is a calibration point, and a field probe to be calibrated and fixedly installed on the clamp is perpendicular to the same PCB board or the independent PCB boards, and a probing center of the field probe coincides with the calibration point, and the field probe is the electric field probe or the magnetic field probe; and wherein the vector network analyzer is respectively connected with the first excitation port on the first group of microstrip lines, the second excitation port on the second group of microstrip lines and an output port of the field probe; and the data processing unit is used for calculating a calibration factor of the field probe at a calibration frequency point.

2. The calibration system for an electric field probe and a magnetic field probe based on multiple components according to claim 1, wherein the first group of microstrip lines adopts single microstrip lines or differential lines under common mode excitation, and the second group of microstrip lines adopts differential lines under differential mode excitation.

3. The calibration system for an electric field probe and a magnetic field probe based on multiple components according to claim 1, wherein a calculation formula of the calibration factor is:

$$\begin{bmatrix} \alpha(f) \\ \beta(f) \end{bmatrix} = \begin{bmatrix} H_y^1(f) & E_x^1(f) \\ H_y^2(f) & E_x^2(f) \end{bmatrix}^{-1} \begin{bmatrix} S_{13}(f) \\ S_{23}(f) \end{bmatrix} \sqrt{2Z_3},$$

where for the magnetic field probe, $\alpha_m$ is a calibration factor of a probe to a magnetic field to be measured, and $\beta_m$ is a coupling degree of the probe to a non-to-be-measured electric field; for the electric field probe, $\alpha_e$ is a coupling degree of the probe to a non-to-be-measured magnetic field, and $\beta_e$ is a calibration factor of the probe to an electric field to be measured; $H_y^1$ and $E_x^1$ respectively represent a magnetic field strength and an electric field strength at the calibration point when an excitation power of 1 W is applied to the first excitation port, $H_y^2$ and $E_x^2$ respectively represent a magnetic field strength and an electric field strength at the calibration point when an excitation power of 1 W is applied to the second excitation port; $S_{13}$ and $S_{23}$ are scattering parameters measured by the vector network analyzer; $Z_3$ is an impedance connected to a terminal of the probe; f is a calibration frequency.

4. A calibration method based on the calibration system for an electric field probe and a magnetic field probe according to claim 1, comprising the following steps:
1) Fixing a relative position of the microstrip line calibration assembly and the field probe at the clamp, in such a manner that the field probe is perpendicular to the PCB board where a microstrip line is located, and the probing center of the field probe coincides with the calibration point;
2) Connecting the first excitation port on the first group of microstrip lines, the second excitation port on the second group of microstrip lines and the output port of the field probe to the vector network analyzer, respectively; applying excitation signals with different calibration frequencies through a signal source inside the vector network analyzer, and then measuring a scattering parameter matrix $$\begin{bmatrix} S_{11} & S_{12} & S_{13} \\ S_{12} & S_{22} & S_{23} \\ S_{13} & S_{23} & S_{33} \end{bmatrix}$$

of three ports by the vector network analyzer, where $S_{ij}$((i, j=1,2,3)) changes with a frequency f;
3) For the microstrip line calibration assembly prepared according to step 1), applying an excitation power of 1W at the first excitation port on the first group of microstrip lines to obtain a magnetic field strength $H_y^1$ and an electric field strength $E_x^1$ at the calibration point; in the same way, applying an excitation power of 1W at the second excitation port of the second group of microstrip lines to obtain a magnetic field strength $H_y^2$ and an electric field strength $E_x^2$ at the calibration point; taking $H_y^1$, $E_x^1$, $H_y^2$, $E_x^2$ as reference values of an electromagnetic field generated by the microstrip line calibration assembly; and
4) Calculating, according to $S_{13}$ and $S_{23}$ obtained by the vector network analyzer in step 2) and $H_y^1$, $E_x^4$, $H_y^2$, $E_x^2$ obtained in step 3), calibration factors α and β the field probe to be measured at each calibration frequency point using the data processing unit by the following formula:

$$\begin{bmatrix} \alpha(f) \\ \beta(f) \end{bmatrix} = \begin{bmatrix} H_y^1(f) & E_x^1(f) \\ H_y^2(f) & E_x^2(f) \end{bmatrix}^{-1} \begin{bmatrix} S_{13}(f) \\ S_{23}(f) \end{bmatrix} \sqrt{2Z_3},$$

where for the magnetic field probe, $\alpha_m$ is a calibration factor of a probe to a magnetic field to be measured, and $\beta_m$ is a coupling degree of the probe to a non-to-be-measured electric field; for the electric field probe, $\alpha_e$ is a coupling degree of the probe to a non-to-be-measured magnetic field, and $\beta_e$ is a calibration factor of the probe to an electric field to be measured.

* * * * *